(12) United States Patent
Tsukamoto

(10) Patent No.: US 6,781,230 B2
(45) Date of Patent: Aug. 24, 2004

(54) FLAT CIRCUIT INTERCONNECTING DEVICE

(75) Inventor: Masashi Tsukamoto, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 10 days.

(21) Appl. No.: 10/195,393

(22) Filed: Jul. 16, 2002

(65) Prior Publication Data

US 2003/0016509 A1 Jan. 23, 2003

(30) Foreign Application Priority Data

Jul. 18, 2001 (JP) ........................................ 2001-218384

(51) Int. Cl.[7] ............................................. H01L 23/12
(52) U.S. Cl. ........................ 257/700; 257/690; 257/692; 257/734; 439/67; 439/77; 439/329; 439/531
(58) Field of Search ................................. 257/181, 664, 257/665, 688, 690, 692, 700, 734, E23.055, E23.065, E23.078, E23.177; 439/67, 77, 329, 445, 531

(56) References Cited

U.S. PATENT DOCUMENTS

| 3,629,787 A | * | 12/1971 | Wilson ........................ 439/67 |
| 3,829,817 A | * | 8/1974 | Beavitt ........................ 439/59 |
| 5,044,980 A | * | 9/1991 | Krumme et al. ............ 439/496 |
| 5,345,205 A | * | 9/1994 | Kornrumpf ................. 333/246 |
| 5,383,788 A | * | 1/1995 | Spencer ..................... 439/67 |
| 6,027,366 A | * | 2/2000 | Mori et al. ................. 439/495 |

* cited by examiner

Primary Examiner—Minhloan Tran
Assistant Examiner—Scott R. Wilson
(74) Attorney, Agent, or Firm—Armstrong, Kratz, Quintos, Hanson & Brooks, LLP

(57) ABSTRACT

A flat circuit device without additional terminals can be connected with a connector. An insulator includes a bent portion and a laminated portion of a first and a second insulators forming the bent portion, and ends of a first conductor and a second conductor extend straightly at the bent portion along a curved surface of the bent portion. Thereby, the first conductor and the second conductor are formed straightly in parallel on an outer surface of the bent portion so that the bent portion performs as a connecting terminal.

8 Claims, 8 Drawing Sheets

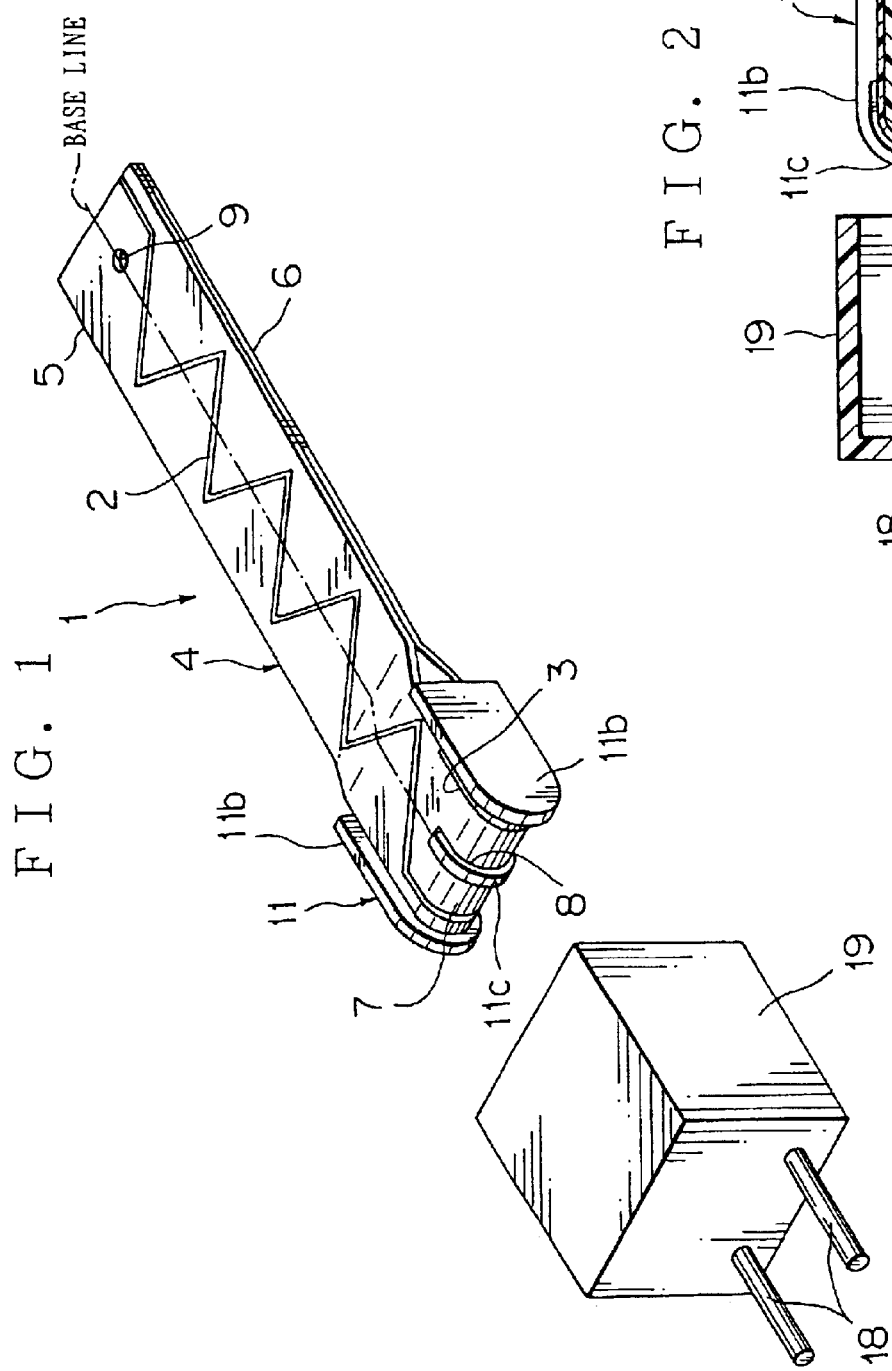
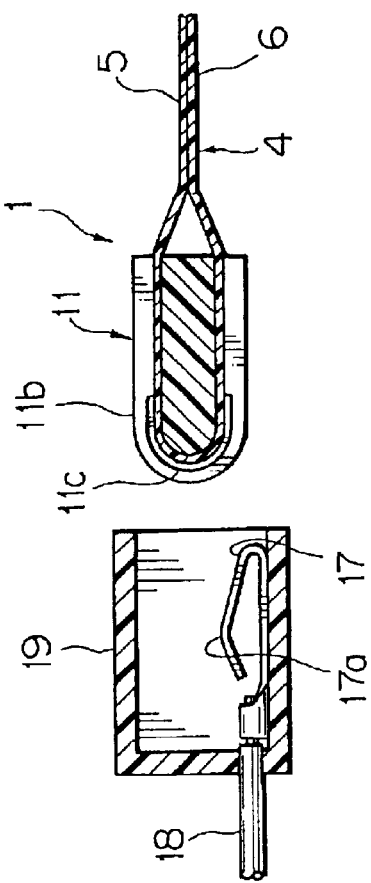

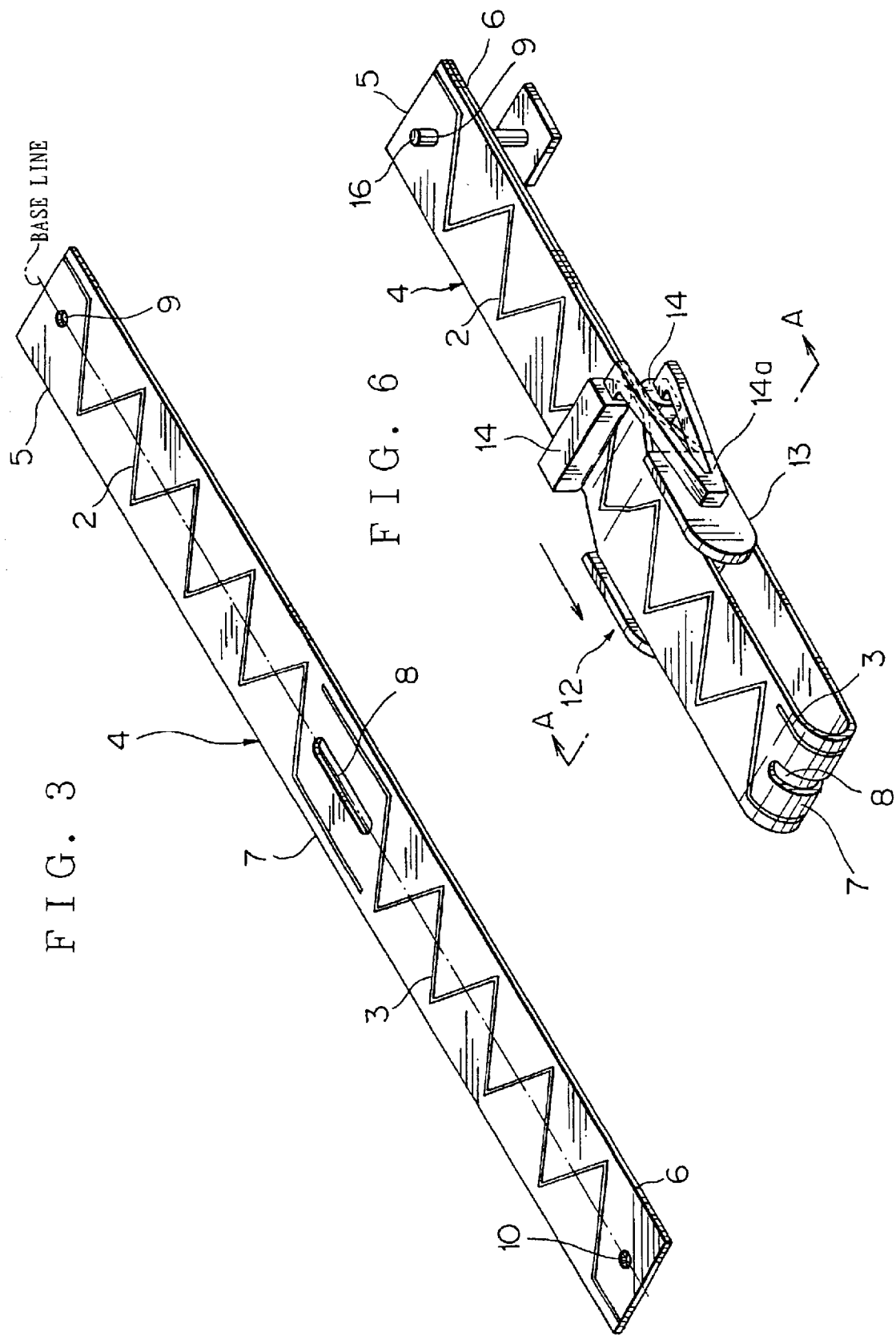

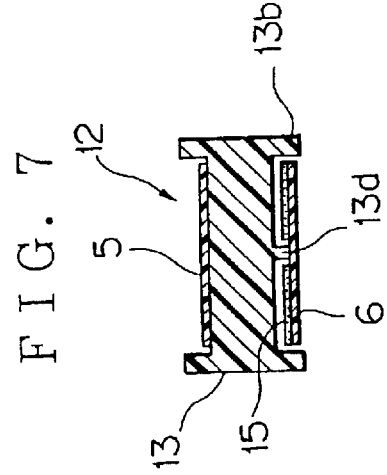
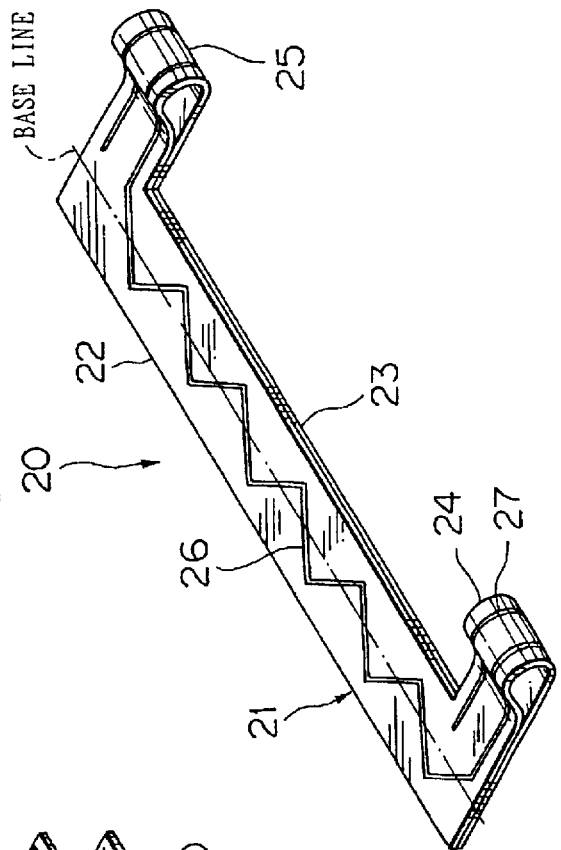
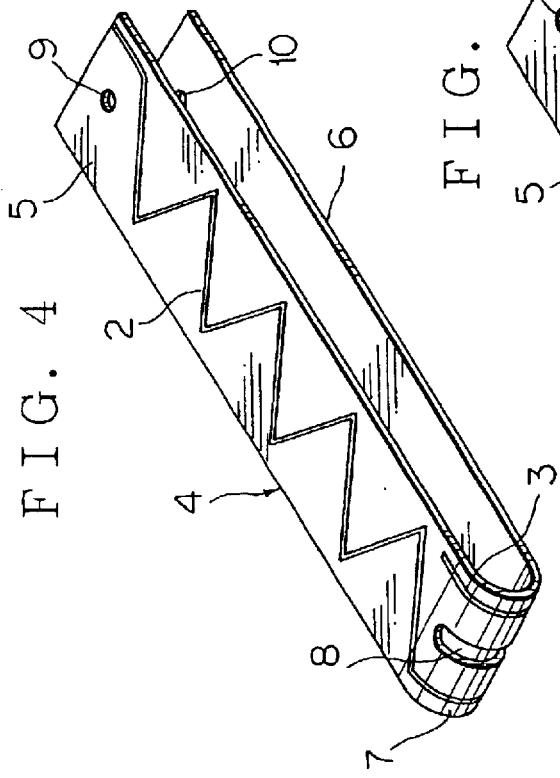
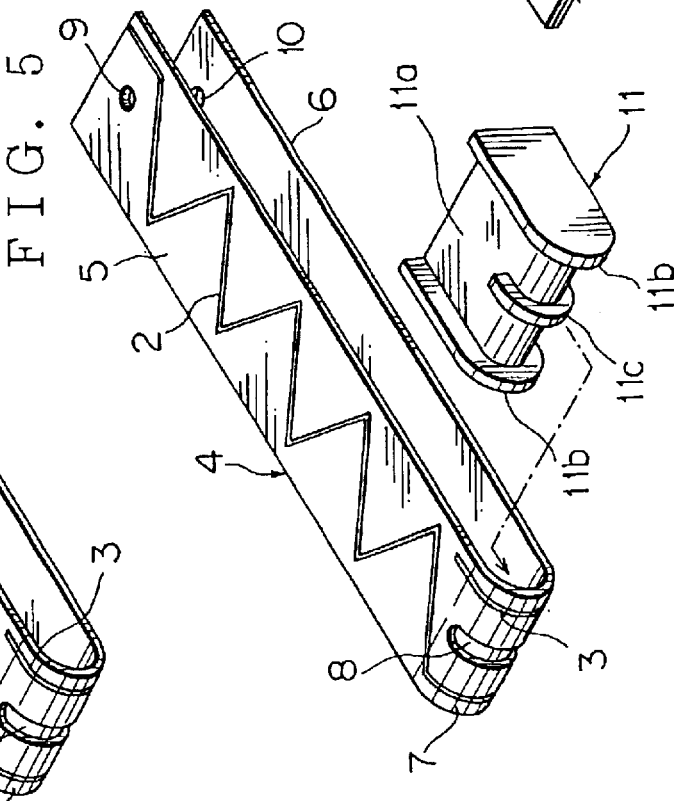

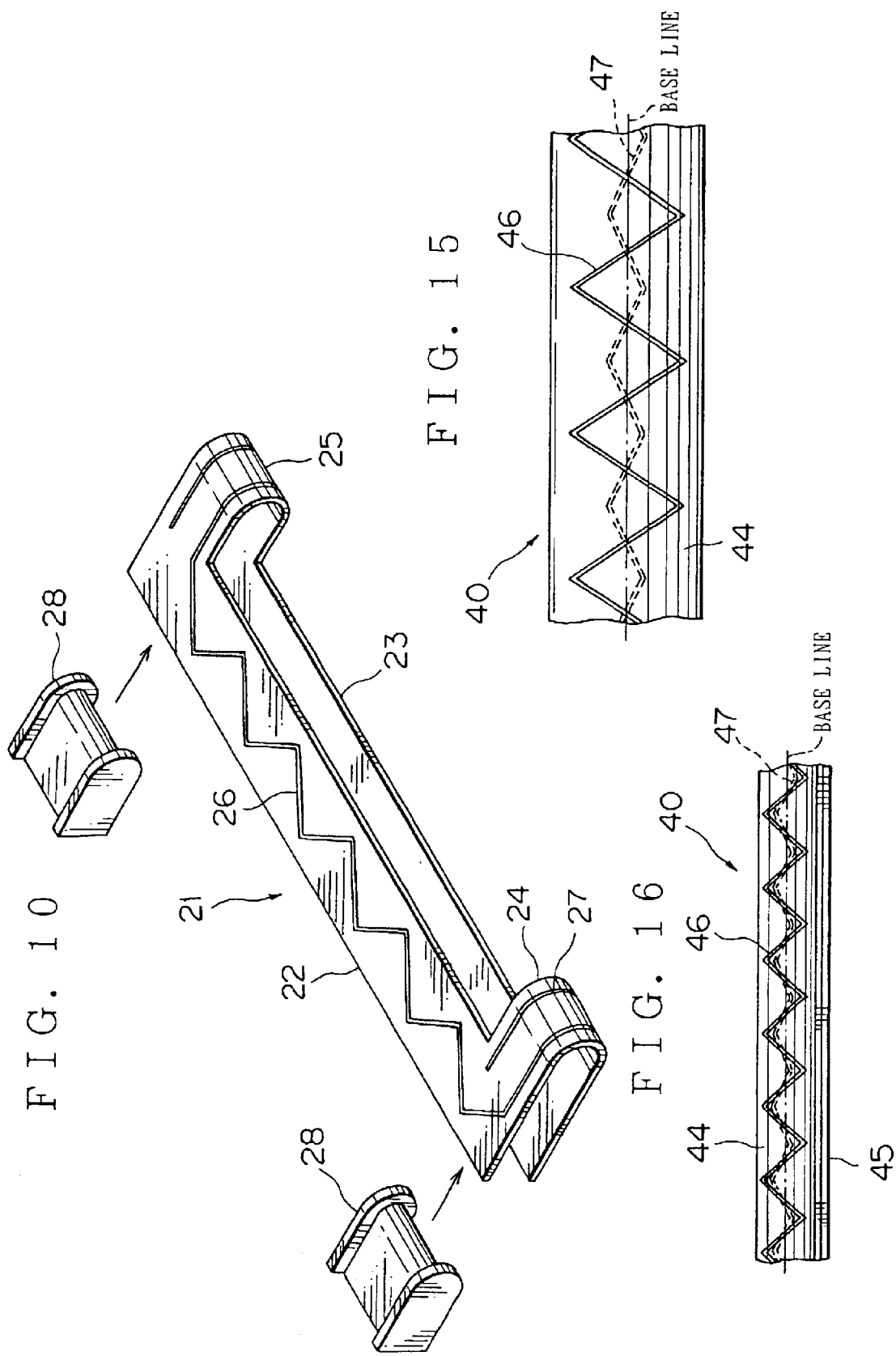

FLAT CIRCUIT INTERCONNECTING DEVICE

BACKGROUND OF THE INVENTION

1. Field of the Invention

This invention relates to a flat circuit device, which is applied for an electric wiring in a car or in an electronic equipment and a method of manufacturing the flat circuit device, especially to the flat circuit device which can be connected with a connector without another special terminals and the method of manufacturing the flat circuit device.

2. Description of the Related Art

A flat circuit device is used for an electric wiring in a car or electronic equipment, and has an electromagnetic shield type without a shield layer, which is disclosed by J.P.A. H5-120928.

In the flat circuit device, there are a flat device 54 being formed to join a first insulating film 51 having a first flat conductor 50 on one side surface thereof and a second insulating film 53 having a second flat conductor 52 on one side surface thereof with an adhesive as shown in FIGS. 17, 18, and a flat circuit device 59 being formed to fold one sheet of insulating film 55, having separately a first flat conductor 56 and a second flat conductor 57 at a predetermined distance on one side surface thereof, on a folding axis 58 between the flat conductors 56, 57 and join the other surface of the film together with an adhesive as shown in FIGS. 19, 20. The first and second flat conductors 50, 52, 56, 57 are formed into a meandering curve like a sine wave and are located symmetrically on practically one axial line when viewing from a direction perpendicular to surfaces of the flat circuit devices 54, 59.

Thereby, when a magnetic flux is given in a direction perpendicular to a surface of the flat circuit device 54 or 59 (a direction of thickness), noise generation is suppressed. When a magnetic flux is given in a direction of thickness of the flat circuit device 54 or 59, induced voltages V11 and V12 are generated oppositely in each adjacent area of the first flat conductor 50 or 56 and the second flat conductor 52 or 57 so that the induced voltages V11 and V12 in each adjacent area of the respective flat conductors 50, 52, 56, 57 cancel each other, and then a large induced voltage in total as a noise is not generated. On the other hand, when currents flow oppositely in the first flat conductor 50 or 56 and in the second flat conductor 52 or 57, magnetic flux is generated in opposite directions in each adjacent area so that the magnetic fluxes generated in adjacent areas cancel each other to suppress noise generation.

The flat circuit device mentioned above is formed to provide a flat insulator between the first flat conductor and the second flat conductor so that the flat circuit can not connected with a connector without a connecting terminal to be joined with an end of the flat conductors. Thus, another terminals are required and then when terminals are forgotten to be joined or lost, the flat circuit device cannot be connected with a connector.

To overcome the above drawback of prior art, one object of this invention is to provide a flat circuit device which can be connected to a connector without another terminals and the method of manufacturing the flat circuit device.

SUMMARY OF THE INVENTION

In order to attain the objects, a flat circuit device according to this invention includes a first conductor, a second conductor, and an insulator being provided between the first conductor and the second conductor, wherein the first conductor and the second conductor are located to form an area being surrounded by the first conductor and the second conductor when viewing from a direction perpendicular to a surface of the insulator, wherein the insulator includes a bent portion and a laminated portion of a first insulator and a second insulator forming the bent portion, whereby a side end of the bent portion of the first conductor extends straightly along a curved surface of the bent portion, whereby a side end of the second conductor at the bent portion extends straightly along a curved surface of the bent portion.

Structured as mentioned above, an end portion of the first bent portion and an end portion of the second bent portion are formed straightly along respective outer surfaces of the bent portions so that the bent portions can perform as connecting terminals to be connected to the other connecting terminals. Therefore, the flat circuit device can be connected to a connector without another terminals.

Preferably, the insulator is laminated by folding a flexible flat strip-like insulator and a pressing rib having a contact surface with U-shape in cross section to be contacted to the insulator is provided in the bent portion.

Providing the pressing rib in the bent portion as mentioned above, when the bent portion is contacted to the connecting terminals, the bent portion is not deformed so that the first and second conductors are contacted to the connecting terminals in good condition to ensure electrical connection.

Preferably, the insulator is laminated with a first insulator and a second insulator to fold a flexible flat insulator, which is provided in parallel with two strip-like portions of the first insulator and the second insulator to be connected by two portions of a first joining portion and a second joining portion, curvedly at the joining portions, and the first conductor is provided on the first insulator along lengthwise thereof to form one end portion of the first conductor extending straightly at the first joining portion and the other end portion of the first conductor extending straightly at the second joining portion, and the second conductor is provided on the second insulator along lengthwise thereof to form one end portion of the second conductor extending straightly at the first joining portion and the other end portion of the second conductor extending straightly at the second joining portion.

Structured as mentioned above, respective both end portions of the first conductor extend straightly at the first joining portion and the second joining portion along surfaces of the joining portions and respective both end portions of the second conductor extend straightly at the first joining portion and the second joining portion along surfaces of the joining portions so that the first joining portion and the second joining portion perform respectively connecting terminals to be connectable to other connector terminals. Therefore, the flat circuit device can be connected to a connector without another terminals at the both end portions of the first and the second conductors.

Preferably, the first and second conductors are formed into meandering curves symmetrical on respective base lines which are located on practically the same straight line when viewed from a direction perpendicular to a surface of the insulator, and the first and the second insulators are provided respectively with insulating pieces for surrounding alternately turning portions of the first and the second conductors forming areas surrounded by the first and the second conductors, and are provided respectively with slits for inserting the insulating pieces therethrough to place partial areas of the first and the second conductors respectively on each surface opposite to the laminated surface of the other insulator.

Structuring as mentioned above, an area surrounded by the first and the second conductors is formed between two cross points of the conductors when viewing from a direction of width of the flat circuit device so that, even if magnetic flux in a direction of the width is provided, induced voltages are generated oppositely in each adjacent area of the first conductor and the second conductor and then, the induced voltages in each area of the respective conductors cancel each other and generating a noise is depressed. When currents flow oppositely in the first conductor and in the second conductor and magnetic flux of directions of thickness and width of the flat circuit device is generated in each adjacent area, the magnetic fluxes flow alternately in opposite directions in order of directions of thickness and width so that the magnetic fluxes cancel each other to suppress noise generation. Thus, the induced voltage by magnetic fluxes in directions of thickness and width of the flat circuit device are canceled to depress generating a noise, and shield effect of the flat circuit device is enhanced.

Preferably, the first conductor is formed into a wave-shape meandering curve and the second conductor is formed into a curve having a smaller amplitude than that of the first conductor on a base line to be a straight line being located on practically the same base line of the first conductor when viewing from a direction perpendicular to the surface of the insulator to place cross points of the first and the second conductor on the straight line, and the laminated two insulators is curved or bent to place the base line of the first conductor on top of curved form when viewing from a direction perpendicular to the surface of the insulator and to place the base line of the second conductor on practically the same straight line as the base line of the first conductor being formed into a wave-shape meandering curve when viewed from a direction of width of the insulator.

Structured as mentioned above, an area surrounded by the first and the second conductors is formed between two cross points of the conductors when viewing from a direction of width of the flat circuit device so that, even if magnetic flux in a direction of the width is provided, induced voltages are generated oppositely in each adjacent area of the first conductor and the second conductor and then, the induced voltages in each area of the respective conductors cancel each other and generating a noise is depressed. When currents flow oppositely in the first conductor and in the second conductor and magnetic flux of directions of thickness and width of the flat circuit device is generated in each adjacent area, the magnetic fluxes flow alternately in opposite directions in order of directions of thickness and width so that the magnetic fluxes cancel each other to depress noise generation. Thus, the induced voltage by magnetic fluxes in directions of thickness and width of the flat circuit device are canceled to suppress noise generation and the shield effect of the flat circuit device is enhanced.

Preferably, a pressing rib having a contact surface with U-shape in cross section to be contacted to the insulator is provided in the curved joining portion.

Providing the pressing rib in the joining portion as mentioned above, when the curved joining portion is contacted to the connecting terminals, the joining portion is not deformed so that the first and second conductors are contacted to the connecting terminals in good condition to ensure electrical connection.

Preferably, the insulator has a slit portion along a bent curve between the first conductor and the second conductor on a bent portion of the insulator and the pressing rib has a center-adjust projecting piece to be inserted into the slit portion on the contact surface of the pressing rib.

Structured as mentioned above, the center-adjust projecting piece performs a partition to part the first conductor and the second conductor in the curved portion so that, when the flat circuit device is contacted to a connecting terminal, contact failure of the conductor caused by shifting the terminal widthwise in the insulator does not exist and the terminals can be contacted securely to the first conductor and the second conductor.

Preferably, the insulator has positioning holes, at the both end portions thereof, to be located on the same axis when the insulator is laminated.

Structured as mentioned above, to insert a positioning pin into the positioning holes being provided in the vicinity of the both end portions (a first and a second end portions) of the insulator when laminating the insulator, relative position of the first and the second insulators is always maintained in the same position so that the first and the second conductors can be positioned precisely and easily and then positioning accuracy and manufacturability of the flat circuit device are enhanced.

A method of manufacturing a flat circuit device comprises steps of providing a first conductor being formed on one side surface of a flexible flat strip-like insulator into a straight line extending along lengthwise the flexible flat strip-like insulator at central area of the insulator and into a wave-shape meandering curve from the straight line to one end of the insulator along the surface of the insulator on a base line of an axis extending along lengthwise the insulator, providing a second conductor being formed on the one side surface of the insulator into a straight line parallel with a predetermined distance to the first conductor at central area of the insulator and into a wave-shape meandering curve with practically the same phase of the first conductor on a base line of an axis being located on the base line of the first conductor from the straight line to one end of the insulator, coating adhesive on the other side surface of the flexible flat insulator from the center thereof to any of ends thereof, folding the flexible flat insulator curvedly at a center portion thereof to make the other surface with coated adhesive inside, laminating the both ends of the flexible flat insulator, clamping the both ends of the insulator with a pair of spring ribs for bonding the both ends by pressure, and sliding the pair of spring ribs from the both ends toward the center portion of the insulator for bonding the insulator.

Thus, bonding the insulator gradually from the both ends to the center portion thereof with pressure by the pair of spring ribs, the insulator can be bonded without air bubbles between the insulator so that the flat circuit device can be manufactured easily and accurately.

Preferably, a positioning pin is inserted into positioning holes to be located coaxially and provided respectively at the both ends of the laminated insulator.

Structured as mentioned above, when bonding the insulator, relative position of the insulator to be bonded is always maintained in the same position so that the first and the second conductors can be positioned precisely and easily and then positioning accuracy and manufacturability of the flat circuit device are enhanced.

Preferably, providing a jig body of a bonding jig having a contact surface with U-shape in cross section to contact with the insulator between the insulator, making the jig body support the pair of spring ribs by means of a removable supporting member, sliding the pair of spring ribs from the both ends to the center portion of the insulator, abutting the jig body on an inner surface of the bent portion of the insulator, and removing the pair of spring ribs together with the supporting member from the jig body, thereby, the jig body is used for a pressing rib.

Structured as mentioned above, the jig body for bonding the insulator can be used for the pressing rib so that another pressing rib is not required and an operation or an equipment to place the another pressing rib in the bent portion of the insulator is not required.

Preferably, the jig body has a bond-protect rib on one contact surface, corresponding to the surface with coated adhesive of the insulator, of two contact surfaces thereof extending in parallel, along lengthwise the one contact surface for preventing the insulator from bonding to the one contact surface.

Structured as mentioned above, the insulator can be bonded without bonding to the jig body.

The above and other objects and features of this invention will become more apparent from the following description taken in conjunction with the accompanying drawings.

BRIEF DESCRIPTION OF THE DRAWINGS

FIG. 1 is a perspective view of a flat circuit device of the first embodiment according to this invention;

FIG. 2 is a sectional view, showing a terminal portion of the flat circuit device of the first embodiment according to this invention;

FIG. 3 is a perspective view of an example of an insulator of the first embodiment according to this invention;

FIG. 4 is a perspective view, showing a folded insulator of the first embodiment according to this invention;

FIG. 5 is a perspective view, showing the folded insulator and a pressing rib of the first embodiment according to this invention;

FIG. 6 is a perspective view of an example of a method of manufacturing the insulator of the first embodiment according to this invention;

FIG. 7 is a sectional view taken along the line A—A in FIG. 6;

FIG. 8 is a perspective view of a flat circuit device of the second embodiment according to this invention;

FIG. 10 is a perspective view, showing a folded insulator of the second embodiment according to this invention;

FIG. 15 is a draft, showing a relative position of the first conductor and the second conductor in a direction of thickness in the second modification of a flat circuit device of the second embodiment according to this invention; and FIG. 16 is a draft, showing a relative position of the first conductor and the second conductor in a direction of width in the second modification of a flat circuit device of the second embodiment according to this invention;

DESCRIPTION OF THE PREFERRED EMBODIMENT

Figure 9:
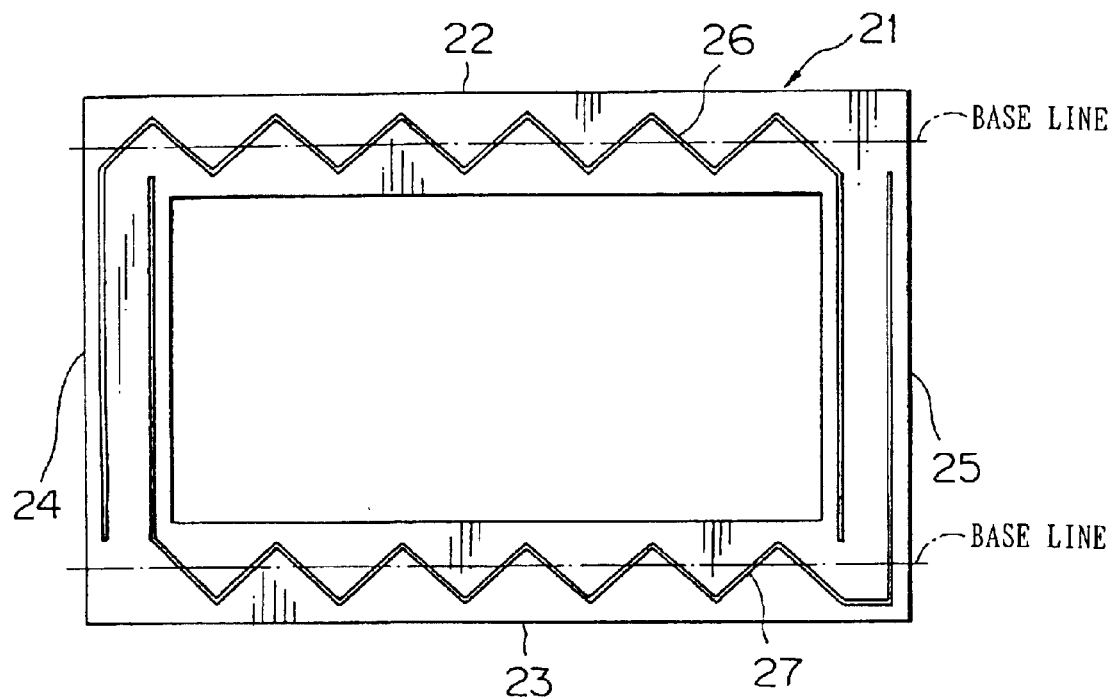
FIG. 9 is a plan view of an example of an insulator of the second embodiment according to this invention.
Figure 12:
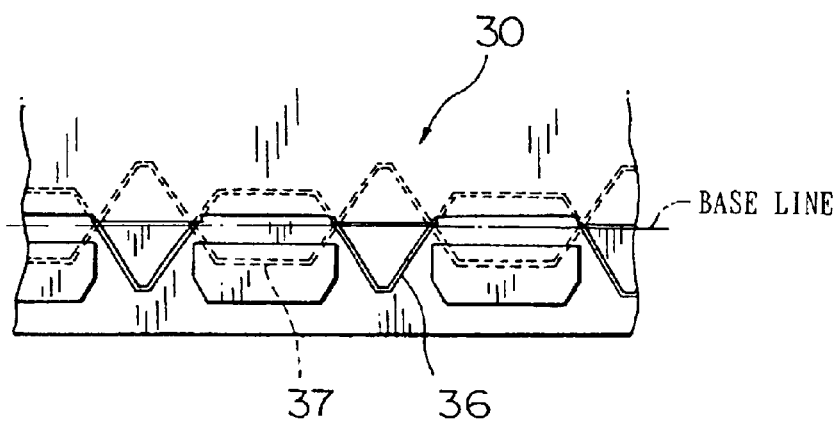
FIG. 12 is a draft, showing a relative position of the first conductor and the second conductor in a direction of thickness in the first modification of a flat circuit device of the second embodiment according to this invention.

An embodiment according to this invention will now be described with reference to figures.

FIG. 1 shows a perspective view of a flat circuit device according to a first embodiment of this invention. In FIG. 1, the mark 1 is a flat circuit device and the flat circuit device 1 has an insulator 4 between a first conductor 2 and a second conductor 3.

The insulator 4 includes a bent portion and a laminated portion by laminating two of a first and a second insulator 5, 6 which form the bent portion. For example, the insulator 4 is formed by means of folding a flexible flat insulator with a conductor curvedly in two.

Physically, the insulator 4 is formed with a flat strip-like insulating film (flexible flat insulator) being made of a bendable flexible insulating material. The insulator 4 includes the first insulator 5 from a center portion to one end thereof, the second insulator 6 from the center portion to the other end thereof and a terminal portion 7 as a bent portion of the center portion and is provided, on one side surface (upper surface for example), with the first conductor 2 and the second conductor 3.

The first conductor 2 extends at the terminal portion 7 and at the first insulator 5 of the insulator 4 along lengthwise thereof and is formed straightly in parallel to lengthwise of the insulator 4 between the center portion widthwise and one side portion of the insulator 4 at the terminal portion 7. The first conductor 2 is formed at the first insulator 5 into a wave-shape meandering curve having top portions and bottom portions along the surface on a base line of an axis extending in widthwise center portion of the insulator 4 along lengthwise thereof. The curving shape of the first conductor 2 is not limited and may be bending shape or a zigzag shape, for example, zigzag shape with the same shapes of top and bottom portions. Physically, the first conductor 2 is formed into zigzag shape having an isosceles triangles shape with the same shapes of the top and bottom portion.

The second conductor 3 extends at the terminal portion 7 and at the second insulator 6 along lengthwise thereof and is formed straightly in parallel to the first conductor 2 between the center portion widthwise and one side portion of the insulator 4 at the terminal portion 7. Therefore, the first conductor 2 and the second conductor 3 are in parallel on each side of the center portion.

The second conductor 3 may be formed into any shape to form an area surrounded by the first and the second conductors when viewing from a direction perpendicular to a surface of the insulator. Preferably, the second conductor 2 is formed into a wave-shape meandering curve having top and bottom portions along the surface of the insulator on a base line of an axis extending at the widthwise center portion of the insulator 4 along lengthwise thereof. Curving shape of the second conductor 3 is not limited and may be a bending shape or a zigzag shape. Preferably, the second conductor 3 is formed into a curve having the same phase of the curve of the first conductor 2. Physically, the second conductor 3 is formed into a zigzag shape having an isosceles triangles shape with the same shapes of the top and bottom portion, practically the same shape as the first conductor 2, and is located to be symmetrical to the first conductor 2 on the base line viewing from a direction perpendicular to the surface of the insulator when combining (bonding) the first insulator 5 and the second insulator 6 together.

The insulator 4 is provided, at the terminal portion 7 in the widthwise center portion thereof, with a slit portion 8 extending along lengthwise thereof to be parallel to the first and the second conductors 2, 3, making three lines widthwise thereof.

The insulator 4 is also provided, respectively in the vicinity of the both ends (ends of the first and the second insulators 5, 6), with positioning holes 9, 10 having mostly the same shape, such as round shape. The positioning holes 9, 10 are located to place base lines of the first conductor 2 and the second conductor 3 on the same line and to make the first and the second conductors 2, 3 symmetrical on the line viewing from a direction perpendicular to the surface of the insulator when the positioning holes are placed on the same axis by laminating the first insulator 5 and the second insulator 6.

The insulator 4, as shown in FIG. 4, is folded curvedly on the terminal portion 7 as a folding axis to make the first and the second insulators 5, 6 facing to each other with a predetermined space. A pressing rib 11 is placed in the curved terminal portion 7 (bent portion) as shown in FIG. 5.

The pressing rib 11 has a contact surface 11a to abut on the terminal portion 7 of the insulator 4 for maintaining a curving shape of the terminal portion 7. The contact surface 11a is formed into U-shape in cross section (section along lengthwise insulator 4) with a curved surface and two parallel contact surfaces extending from the curved surface to have a width thereof slightly wider than the width of the insulator 4. The pressing rib 11 has, respectively, at the both ends of the contact surface 11a, a wall portion 11b along each of the ends of the contact surface 11a to prevent the insulator from moving widthwise. Therefore, the pressing rib 11 is formed into H-shape longitudinal section (section along widthwise insulator 4). The pressing rib 11 is provided, on the curved surface thereof, with a center-adjust projecting piece 11c projecting outwardly in convex shape along curving to be inserted into the slit portion 8 of the insulator 4.

The insulator 4 (the first insulator 5 and the second insulator 6) is bonded by an adhesive. A method of bonding the insulator 4 (the first insulator 5 and the second insulator 6) can be any method which can bond, for example using a fixing agent like an adhesive or heat seal. Preferably, as shown in FIG. 6, bonding is made with a pressure-sensitive adhesive by using bonding jig 12.

The bonding jig 12 includes a jig body 13 being formed into U-shape in cross section (section along lengthwise insulator), a supporting member 14a being mounted removably on the jig body 13, and a pair of spring ribs 14, 14 being supported by the supporting member 14a for clamping the first and the second insulators 5, 6.

Preferably, the jig body 13 has the same shape as the pressing rib 11 to be used as the pressing rib 11. As shown in FIGS. 6 and 7, the jig body 13 has wall portions 13b respectively, at the both end thereof and is formed into U-shape in cross section and H-shape longitudinal section. The jig body 13 is provided, on one (bottom surface for example in a figure) of the parallel contact surfaces contacting to the insulator, with bond-protect rib 13d having lower height than that of the wall portion 13b and extending at a center portion thereof along lengthwise thereof. The bond-protect rib 13d is to protect the parallel surface from bonding to the first insulator 5 or the second insulator 6 being coated with adhesive and may be formed into a continuous piece with a convex shape section extending along lengthwise the parallel contact surface, or into a plurality of separated pieces with a convex shape section being placed in a predetermined interval, or into a lot of projecting pieces being placed in a predetermined interval.

The pair of spring ribs 14, 14 have widths wider than that of the insulator 4. The pair of spring ribs 14, 14 are mounted through the supporting member 14a at the both sides of the jig body 13 to be parallel to widthwise the insulator 4 and to clamp the insulator 4 (the first insulator 5 and the second insulator 6) for pressing. Therefore, the supporting member 14a locates the pair of spring ribs 14, 14 correspondingly and energizes respective spring ribs 14 toward opposite spring ribs 14.

For bonding the insulator 4 (the first insulator 5 and the second insulator 6) with the bonding jig 12, firstly a bonding surface of one of insulators to be bonded, for example, the second insulator 6, is coated with a pressure-sensitive adhesive 15. The insulator 4, as shown in FIG. 4, is folded curvedly on the terminal portion 7 as a folding axis to place the first and the second insulator 5, 6 oppositely with a predetermined space. The jig body 13 is placed between the first and the second insulator 5, 6 to orient a surface with a bond-protect rib 13d toward the second insulator 6. Laminating and bonding the ends of the first and the second insulators 5, 6, placing the pair of spring rib 14, 14 above and below the bonded ends, the ends of the first and the second insulators 5, 6 are pressed. At that time, a positioning pin 16 is inserted through positioning holes 9, 10 provided respectively in the vicinity of the end of the first or the second insulators 5, 6, as shown in FIG. 6.

Sliding the bonding jig 12 from the both ends to a center portion of the insulator 4 in this condition, the first and the second insulators 5, 6 are bonded gradually from the ends. During above action, the bond-protect rib 13d is provided on the contact surface of the jig body 13 facing to the second insulator 6 with coated pressure-sensitive adhesive 15 so that the second insulator 6 is not bonded to the jig body 13 and the first and the second insulators 5, 6 can be bonded.

After the jog body 13 abuts on the terminal portion 7 of the insulator 4, removing the pair of spring ribs 14, 14 from the jig body 13, the jig body 13 performs as the pressing rib 11 actually. Thus, using the bonding jig 12, the flat circuit device 1 according to this invention can be manufactured easily and accurately.

When bonding the first and the second insulators 5 and 6, if the first and the second insulators 5, 6 are bonded at a stroke, some air may be shut between the first and the second insulators 5, 6, and the bonded the first and the second insulators 5, 6 may have rugged surface. Bonding the first and the second insulators 5, 6 gradually from the ends to the center portion with pressure by the pair of spring ribs 14, 14, no air is shut between the first and the second insulators 5, 6 for bonding. Therefore, the flat circuit device 1 can be manufactured easily and accurately.

Furthermore, bonding the insulator 4 with inserting the positioning pin 16 through the positioning holes 9, 10 of the insulator 4 (the first and the second insulators 5, 6), the relative position of the first and the second insulators 5, 6 is always the same so that positioning of the first and the second conductors 2, 3 is easy and accuracy and workability of mounting the flat circuit device 1 are enhanced.

The jig body 13 of the bonding jig 12 for bonding the insulator 4 can be used as the pressing rib 11 so that the other pressing rib 11 is not required and an operation or an equipment to place the other pressing rib 11 in the terminal portion 7 of the insulator 4 is not required.

The flat circuit device 1 includes the first conductor 2 on the first insulator 5 and the second conductor 3 on the second insulator 6. The base lines of the first and the second conductors 2, 3 are located on the same line when viewing a direction perpendicular to the surface of the insulator 4 and cross points of the first and the second conductor 2, 3 are located on the line to form an area surrounded by the first and the second conductor 2, 3 between two cross points of the conductors. Thereby, when a magnetic flux is given in a direction of thickness (laminating) of the flat circuit device 1, induced voltages are generated oppositely in the first and the second conductor 2, 3 at each adjacent area so that the induced voltages in each adjacent area of the respective conductors cancel each other and then generating induced voltage as a noise is depressed as a whole.

The terminal portion (bent portion) 7 is formed into curving shape such as U-shape with the first conductor 2 and the second conductor 3 straightly in parallel on the outer surface thereof along lengthwise the insulator 4 to perform as connecting terminals. Therefore, as shown in FIGS. 1 and 2, inserting the terminal portion 7 into a connector 19 including an electric wire 18, an end of which is joined with a connecting terminal 17, having an elastic contact portion 17a, the terminal portion 7 contacts to the connecting terminal 17, the contact portion 17a of which is deformed elastically, so that the connecting terminals 17 are connected electrically with the first and the second conductors 2, 3. When the terminal portion 7 abuts on the connecting terminal 17, if the pressing rib 11 is provided in the terminal portion 7, the terminal portion 7 is not deformed and the connecting terminals 17 contact satisfactorily to the first and the second conductor 2, 3 to be connected electrically securely.

Furthermore, providing the slit portion 8 at the center portion of the terminal portion 7 and inserting the center-adjust projecting piece 11c of the pressing rib 11 into the slit portion 8, the center-adjust projecting piece 11c performs as a partition wall to part the contact surface 11a to the first conductor 2 and the second conductor 3 so that the connecting terminals 17 can be contacted satisfactorily to the first and the second conductor 2, 3 without contact failure caused by moving the connecting terminals 17 widthwise of the insulator 4.

Thus, the terminal portion 7 performs as connecting terminals so that the flat circuit device 1, according to this invention, without another terminals can be connected with a connector.

FIG. 8 shows a perspective view of a flat circuit device of the second embodiment according to this invention. In FIG. 8, marking 20 shows a flat circuit device differing from the flat circuit device 1 by having two terminal portions (bent portions).

An insulator 21, as shown in FIG. 9, is provided in parallel with two insulators of a first and a second insulators 22, 23 being joined at two position with a first and a second joining portions 24, 25 to form a flexible flat insulator. The first and the second insulators 22, 23 are laminated to fold the flexible flat insulator curvedly on the joining portions as a folding axis to form the first and the second joining portions 24, 25 to terminal portions (bent portions), as shown in FIG. 8.

Physically as shown in FIG. 9, providing a rectangular opening in the flexible flat insulator being formed into long sideways rectangular, the flexible flat insulator 21 is formed into rectangular window frame shape having four insulators 22, 23, 24, 25. Folding the flexible flat insulator 21 curvedly at two insulators (the first and the second joining portions) 24, 25 extending along widthwise as shown in FIG. 8, remaining two insulators (the first and the second insulators) 22, 23 are laminated. The first and the second joining portion 24, 25 being folded curvedly are formed respectively as terminal portions (bent portions).

A first conductor 26 is provided curvedly along lengthwise of the insulator 21 on one side surface (top surface, for example) of the insulator 21 (the first insulator 22). The both ends of the first conductor 26 extend straightly along lengthwise respectively on the first joining portion 24 and the second joining portion 25.

A second conductor 27 is provided curvedly along lengthwise of the insulator 21 on one side surface (top surface, for example) of the insulator 21 (the second insulator 23). The both ends of the second conductor 27 extend straightly along lengthwise respectively on the first joining portion 24 and the second joining portion 25 to be parallel to the first conductor 26.

The curving shape of the first conductor 26 and the second conductor 27 is not limited and may be bending shape or a zigzag shape. Preferably, the conductors are formed into curving shape having the same phase. Physically, the conductors are formed into a zigzag shape having an isosceles triangles shape with the same shapes of the top and bottom portion, and are located to place base lines of the first conductor 26 and the second conductor 27 on the same line and make the first and the second conductors 26, 27 symmetrical on the line as an axis viewing from a direction perpendicular to the surface of the insulator when laminating the first insulator 22 and the second insulator 27.

A pressing rib 28, which is practically the same as the pressing rib 11, is mounted respectively in the two terminal portions (the first and the second joining portions) 24, 25 of the insulator 21.

Structuring as mentioned above, the flat circuit device 20 without another terminals can be connected with a connector.

Folding the flexible flat insulator 21 with rectangular window frame shape as shown in FIG. 9 curvedly at the first joining portion 24 and the second joining portion 25 as a folding axis, as shown in FIG. 10, laminating and bonding the first insulator 22 and the second insulator and mounting the pressing ribs 28 respectively in two terminal portions 24, 25, the flat circuit device 20 according to this invention is provided.

The flat circuit device 20 is provided with a first conductor 26 on the first insulator 22 and a second conductor 27 on the second insulator 23. The conductors 26, 27 are located to place each base line of the first and second conductors 26, 27 on the same line viewing from a direction perpendicular to a surface of the insulator 21 and to place cross points of the first and the second conductors 26, 27 on the line for forming an area surrounded by the first and the second conductors 26, 27 between cross points. Thereby, when a magnetic flux is provided in a direction of thickness (laminating) of the flat circuit device 20, induced voltages are generated oppositely in the first and the second conductor 26, 27 at each adjacent area so that the induced voltages in each adjacent area of the respective conductors cancel each other and then generating induced voltage as a noise is depressed as a whole.

The both ends of the first and the second conductors 26, 27 respectively extend straightly in parallel along lengthwise at two terminal portions 24, 25 (the first and the second joining portions) so that the two terminal portions 24, 25 perform respectively as a connecting terminal. Therefore, inserting the terminal portion 24 or 25 into a connector including an electric wire, an end of which is joined with a connecting terminal, having an elastic contact portion, the contact portion of the connecting terminal is deformed elastically by the terminal portion 24 or 25, so that the connecting terminal is connected electrically with the first conductor 26 or the second conductor 27. When the terminal portion abuts on the connecting terminal, if the pressing ribs 28 are provided in the terminal portions 24, 25, the terminal portions are not deformed and the connecting terminals contact satisfactorily to the first and the second conductors 26, 27 to be connected electrically securely.

Thus, the two terminal portions 24, 25 of the flat circuit device 20 according to this invention perform respectively as a connecting terminal so that the first and the second conductors 26, 27 without another terminals at the both end thereof can be connected with a connector.

Providing positioning holes (not shown) respectively in the first and second insulators 22, 23 as mentioned above and inserting a positioning pin through the positioning holes when the insulator 21 is bonded, relative position of the first and the second insulators 22, 23 is always maintained in the same position so that the first and the second conductors 26, 27 can be positioned easily and then positioning accuracy and manufacturability of the flat circuit device 20 are enhanced.

Providing the slit portions (not shown) respectively at the center portion of each terminal portion 24, 25 and inserting the center-adjust projecting pieces (not shown) of the pressing ribs into the slit portions, the center-adjust projecting pieces perform as partition walls to part the curved surfaces to the first conductor 26 and the second conductor 27 so that the connecting terminals can be contacted satisfactorily to the first and the second conductor 26, 27 without contact failure caused by moving the connecting terminals widthwise of the insulator.

Figure 11:
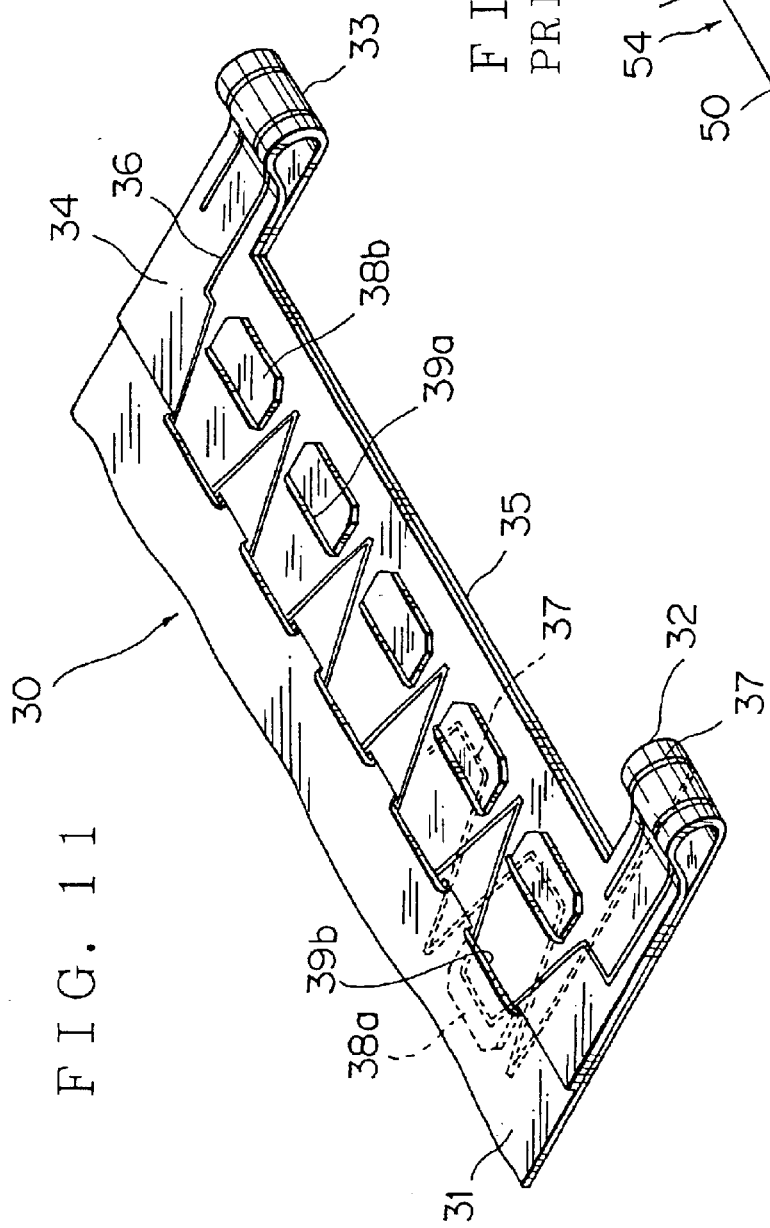
FIG. 11 is a perspective view, showing the first modification of a flat circuit device of the second embodiment according to this invention.
Figure 17:
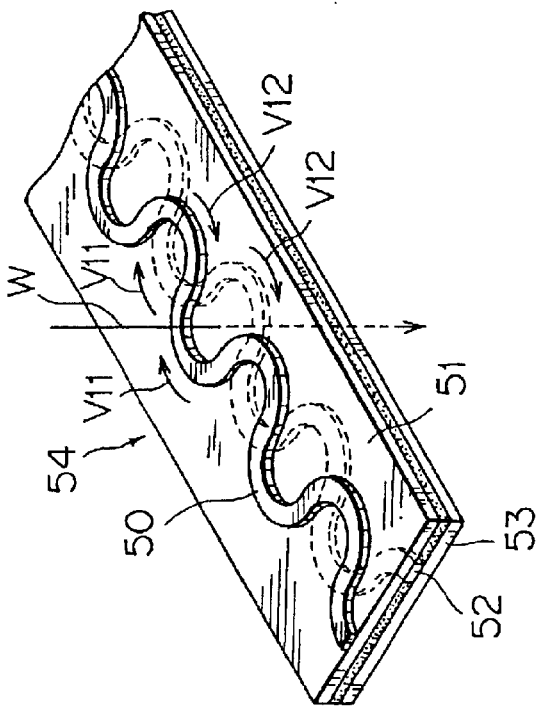
FIG. 17 is a perspective view of the first example of a flat circuit device by prior art.

FIG. 11 shows a perspective view of first modification of a flat circuit device of the second embodiment according to this invention. In FIG. 11, marking 30 shows a flat circuit device which can be connected to a connector without another connecting terminals and additionally be improved on shield effect.

Physically, an insulator 31 is formed by folding the flexible flat insulator with rectangular window frame shape, having a rectangular opening therein to form four insulators, curvedly at two insulators (a first and a second joining portions) 32, 33 extending along widthwise, and laminating and bonding remaining two insulators (a first and a second insulators) 34, 35. The first and the second joining portion 32, 33 being folded curvedly are formed respectively as terminal portions (bent portions).

A first conductor 36 is provided curvedly along lengthwise of the insulator 31 on one side surface (top surface, for example) of the insulator 31 (the first insulator 34). The both ends of the first conductor 36 extend straightly along lengthwise respectively on the first joining portion 32 and the second joining portion 33.

A second conductor 37 is provided curvedly along lengthwise along the insulator 31 on one side surface (top surface, for example) of the insulator 31 (the second insulator 35). The both ends of the second conductor 37 extend straightly along lengthwise respectively on the first joining portion 32 and the second joining portion 33 to be parallel to the first conductor 36.

Preferably, the first conductor 36 and the second conductor 37 are formed into a zigzag shape having trapezoid portions and triangle portions with smaller intervals than the trapezoid portions, and are located to place base lines of the first conductor 36 and the second conductor 37 on the same line and make the first and the second conductors 36, 37 symmetrical on the line as an axis and having the same size of surrounded areas, viewing from a direction perpendicular to the surface of the insulator when laminating the first insulator 34 and the second insulator 35.

The first insulator 34 and the second insulator 35 are provided respectively with a plurality of insulating pieces 38a, 38b for surrounding respective trapezoid portions of the first conductor 36 and the second conductor 37 in U-shape. The first insulator 34 and the second insulator 35 are provided, between respective triangle portions of the first conductor 36 and the second conductor 37, with slits 39a, 39b for inserting insulating pieces 38a, 38b (each section including a straight top portion of the first or the second conductor 36, 37) therethrough to abut on a surface opposite to an adhesive surface of the insulator 31. Inserting the insulating pieces 38a of the first insulator 34 through the slits 39b of the second insulator 35, inserting the insulating pieces 38b of the second insulator 35 through the slits 39a of the first insulator 34 to make respective insulating pieces 38a, 38b abut on the surface opposite to the adhesive surface of the insulator, the first insulator 34 and the second insulator 35 are laminated to make areas, which are surrounded by the first and the second conductors 36, 37 between cross points of the conductors, symmetrical on a base line as an axis and have practically the same size of the surrounded area.

Preferably, a means for preventing the insulating pieces from disengaging from slits after inserting the insulating pieces and engaging with the insulating pieces may be provided on the insulating pieces.

Structured as mentioned above, the flat circuit device 30 without additional connecting terminals can be connected to a connector and also the shield effect of the flat circuit device is enhanced. Physically, folding the flexible flat insulator 31 with a rectangular opening curvedly on an axis of the first joining portion 32 and the second joining portion 33 extending widthwise of the insulator, the first insulator 34 and the second insulator 35 are laminated.

For laminating, turning each insulating piece 38a of the first insulator 34 down to be inserted into each slit 39b from the top surface of the second insulator 35, turning each insulating piece 38b of the second insulator 35 up to be inserted into each slit 39a from the bottom surface of the first insulator 34, the first insulator 34 and the second insulator 35 abut each other. Thereafter, the insulating pieces 38a, 38b projecting from the slits 39b, 39a are turned respectively toward opposite side against conductors to abut on the insulators 34, 35. Thus, the flat circuit device 30 can be given.

The flat circuit device 30 includes the first conductor 36 on the first insulator 34 and the second conductor 37 on the second insulator 35. The base lines of the first and the second conductors 36, 37 are located on the same line when viewing a direction perpendicular to the surface of the insulator 31 and cross points of the first and the second conductor 36, 37 are located on the line to form an area surrounded by the first and the second conductors 36, 37 between two cross points of the conductors. Thereby, when a magnetic flux is provided in a direction of thickness (laminating) of the flat circuit device 31, induced voltages are generated oppositely in the first and the second conductor 36, 37 at each adjacent area so that the induced voltages in each adjacent area of the respective conductors cancel each other and then generating induced voltage as a noise is depressed as a whole.

Figure 13:
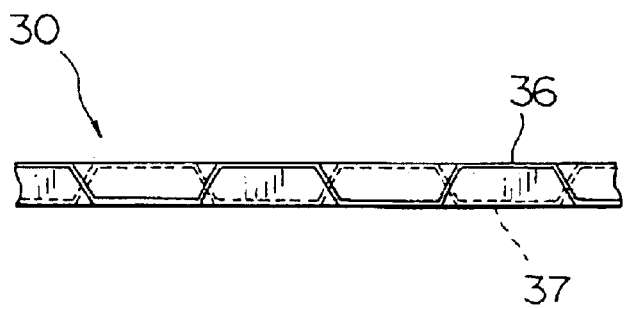
FIG. 13 is a draft, showing a relative position of the first conductor and the second conductor in a direction of width in the first modification of a flat circuit device of the second embodiment according to this invention.

The first conductor 36 on the insulating piece 38a and the second conductor on the insulating piece 38b are placed respectively on the sides opposite to the adhesive surfaces of the second insulator 35 and the first insulator 34 so that the first conductor 36 and the second conductor 37 are alternately change places. Therefore, an area surrounded by the first and the second conductors 36, 37 is formed between two cross points of the conductors when viewing from a direction of width of the flat circuit device 31, as shown in FIG. 13. If magnetic flux in a direction of the width of the flat circuit device 30 is provided, induced voltages are generated oppositely at each adjacent area in the first conductor 36 and the second conductor 37 so that the induced voltages of each area in the respective conductors cancel each other and then generation induced voltages, i.e. generation of a noise is suppressed as a whole.

When currents flow oppositely in the first conductor 36 and in the second conductor 37 to generate magnetic flux of directions of thickness and width of the flat circuit device oppositely in each adjacent area, the magnetic fluxes flow alternately in opposite directions in order of directions of thickness and width so that the magnetic fluxes cancel each other to depress generating a noise.

The both ends of the first conductor 36 and the second conductors 37 respectively extend straightly in parallel along lengthwise at the first and the second joining portions 32, 33 (terminal positions) so that the two terminal portions 32, 33 perform respectively as a connecting terminal. Therefore, inserting the terminal portion 32 or 33 into a connector including an electric wire, an end of which is joined with a connecting terminal, having an elastic contact portion, the contact portion of the connecting terminal is deformed elastically by the terminal portion 32 or 33, so that the connecting terminal is connected electrically with the first conductor 36 or the second conductor 37. When the terminal portion abuts on the connecting terminal, if the pressing ribs (not shown) are provided in the terminal portions 32, 33, the terminal portions 32, 33 are not deformed and the connecting terminals contact satisfactorily to the first conductor 36 or the second conductor 37 to be connected electrically securely.

Thus, the two joining portions (terminal portions) 32, 33 of the flat circuit device 30 according to this invention perform respectively as a connecting terminal so that the first and the second conductors 36, 37 without additional terminals at the both end thereof can be connected with a connector. The induced voltage by magnetic fluxes in directions of thickness and width of the flat circuit device are canceled to suppress noise generation and the shield effect of the flat circuit device is enhanced.

The first insulator 34 and the second insulator 35 can be laminated to insert the insulating piece 38a, 38b into the slits 39b, 39a so that a fixed material such as a pressure-sensitive adhesive is not required for reducing cost. The related position of the first and the second insulators 34, 35 is always maintained so that positioning of the first and the second conductors 36, 37 can be done easily, and assembling accuracy and manufacturability of the flat circuit device 30 are enhanced.

Providing slit portions (not shown) respectively at the center portion of each of the first and the second joining portions (terminal portions) 32, 33 and inserting the center-adjust projecting pieces of the pressing ribs into the slit portions, the center-adjust projecting pieces perform as partition walls to part the curved surfaces to the first conductor 36 and the second conductor 37 so that the connecting terminals can be contacted satisfactorily to the first and the second conductors 36, 37 without contact failure caused by moving the connecting terminals widthwise of the insulator.

Figure 14:
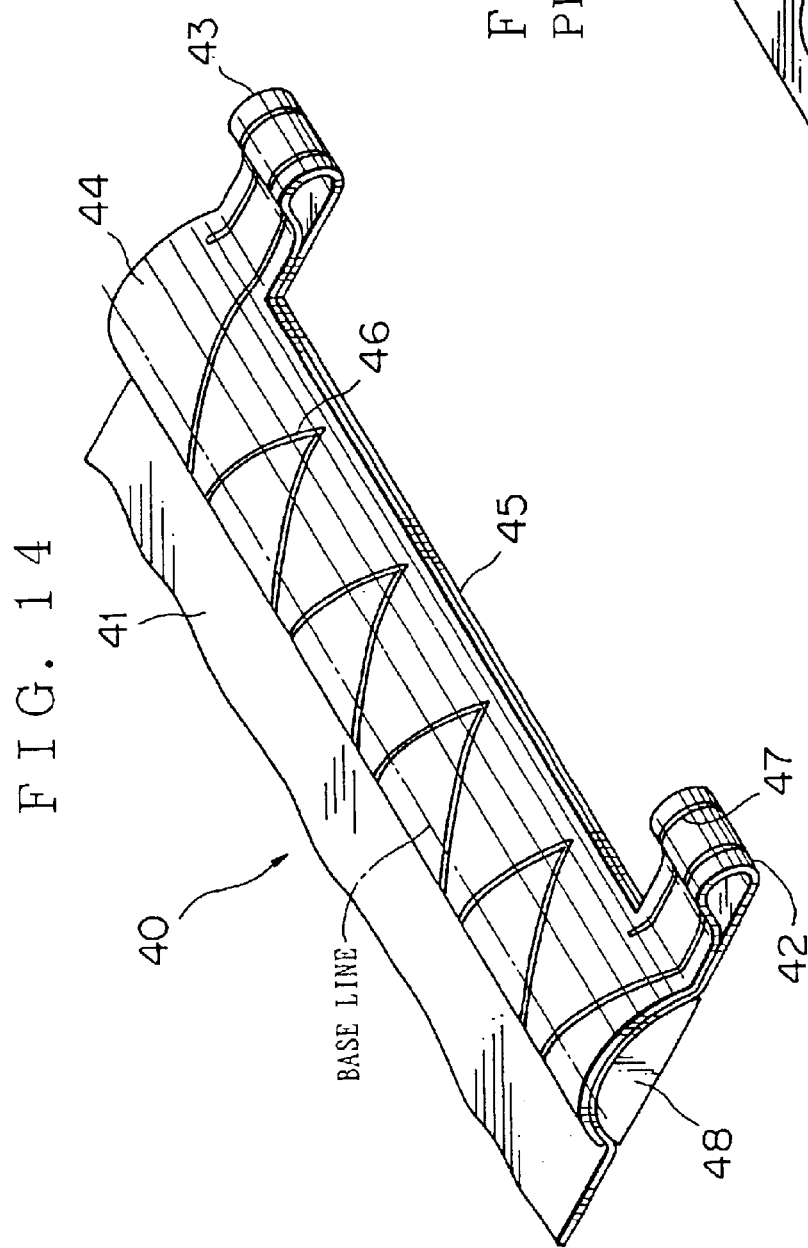
FIG. 14 is a perspective view, showing the second modification of a flat circuit device of the second embodiment according to this invention.
Figure 18:
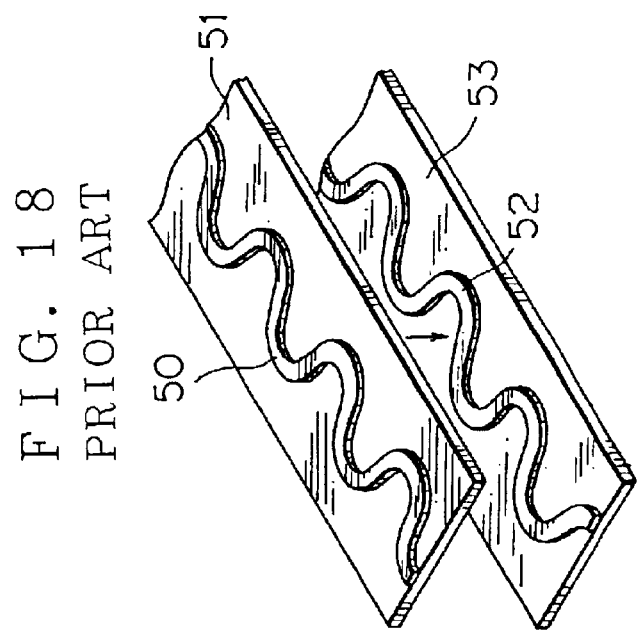
FIG. 18 is a perspective view, showing relation of the first conductor and the second conductor of the first example of a flat circuit device by prior art.
Figure 19:
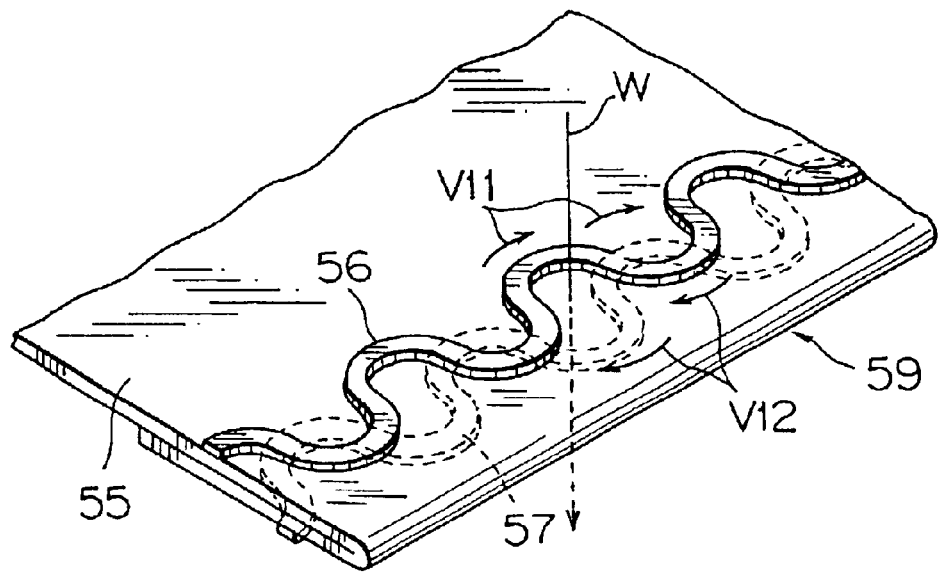
FIG. 19 is a perspective view of the second example of a flat circuit device by prior art.
Figure 20:
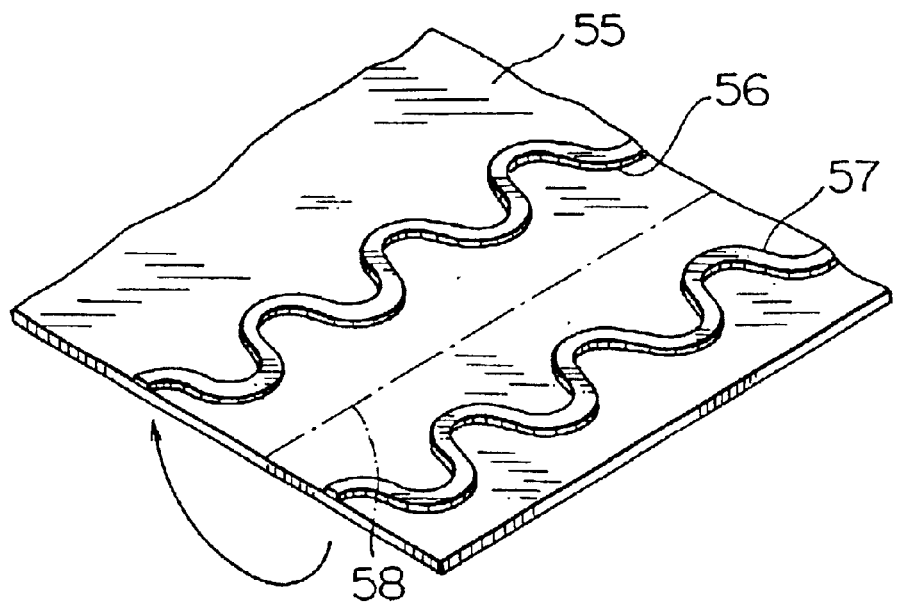
FIG. 20 is a perspective view, showing an insulator of the second example of a flat circuit device by prior art.

FIG. 14 shows a perspective view of second modification of a flat circuit device of the second embodiment according to this invention. In FIG. 14, marking 40 shows a flat circuit device which can be connected to a connector without additional connecting terminals and additionally improved on shield effect.

Physically, an insulator 41 is formed by folding the flexible flat insulator with a rectangular window frame shape, having a rectangular opening therein to form four insulators, curvedly at two insulators (a first and a second joining portions) 42, 43 extending along widthwise, and laminating and bonding remaining two insulators (a first and a second insulators) 44, 45 with pressure-sensitive adhesive. The first and the second joining portion 42, 43 being folded curvedly are formed respectively as terminal portions (bent portions).

A first conductor 46 is provided curvedly along lengthwise of the insulator 41 on one side surface (top surface, for example) of the insulator 41 (the first insulator 44). The both ends of the first conductor 46 extend straightly along lengthwise respectively on the first joining portion 42 and the second joining portion 43.

Curving shape of the first conductor 46 is not limited and may be bending shape or a zigzag shape. Preferably, the curving shape is a zigzag shape having the same shapes for the top and bottom portion. Physically, the first conductor 46 is formed into a zigzag shape having an isosceles triangles shape with the same shapes of the top and bottom portion.

A second conductor 47 is provided curvedly along lengthwise of the insulator 41 on one side surface (top surface, for example) of the insulator 41 (the second insulator 45). The both ends of the second conductor 47 extend straightly along lengthwise respectively on the first joining portion 42 and the second joining portion 43 to be parallel to the first conductor 46.

Preferably, the second conductor 47 is formed into a zigzag shape having an isosceles triangles shape with the same shapes for the top and bottom portion, having a base line of an axis placed on a base line of the first conductor 46 viewing from a direction perpendicular to the surface of the insulator 41, having the same interval as the first conductor 46 and a smaller amplitude than that of the first conductor 46 as shown in FIG. 15. The second conductor 47 may also be formed straight.

The flat circuit device 40 is formed by pushing a laminated the first and the second insulators 44, 45 on a curved surface of a curving jig 48 and bending the insulators along the curved surface to position the base line of the first conductor 46 on the top of bending curve. Bending the insulators is to make the first conductor 46 turning at the top and the bottom of the second conductor 47 as shown in FIG. 16. Bending makes the first conductor 46 and the second conductor 47 respective wave-shape meandering curves so that base lines of the meandering curves made by bending are preferably positioned on the same line. To bend bonded the first and the second insulators 44, 45, a triangle shape jig can be used instead of the curving jig 48.

The first conductor 46 and the second conductor 47 of the flat circuit device 40, when viewing from a direction perpendicular to the surface of the flat circuit device, change places alternately in top-bottom direction (widthwise of the insulator), as shown in FIG. 15, to form an area surrounded by the first and the second conductors 46, 47 between two cross points of the conductors. Thereby, if magnetic flux in a direction of laminating of the flat circuit device 40 is given, induced voltages are generated oppositely at each adjacent area in the first conductor 46 and the second conductor 47 so that the induced voltages of each area in the respective conductors cancel each other and then generating induced voltages, i.e. noise generation is depressed as a whole.

The first conductor 46 and the second conductor 47, when viewed from a direction of width of the flat circuit device, change places alternately in top-bottom direction (a direction of thickness of the insulator), as shown in FIG. 16, to form an area surrounded by the first and the second conductors 46, 47 between two cross points of the conductors. Thereby, if magnetic flux in a direction of the width of the flat circuit device 40 is provided, induced voltages are generated oppositely at each adjacent area in the first conductor 46 and the second conductor 47 so that the induced voltages of each area in the respective conductors cancel each other and then generated induced voltages, i.e. noise generation is suppressed as a whole.

When currents flow oppositely in the first conductor 46 and in the second conductor 47 to generate magnetic flux of directions of thickness and width of the flat circuit device oppositely in each adjacent area, the magnetic fluxes flow alternately in opposite directions in order of directions of thickness and width so that the magnetic fluxes cancel each other to suppress noise generation.

The both ends of the first conductor 46 and the second conductors 47 respectively extend straightly in parallel along lengthwise at the first and the second joining portions 42, 43 (terminal positions) so that the two terminal portions 42, 43 perform respectively as a connecting terminal. Therefore, inserting the terminal portion 42 or 43 into a connector including an electric wire, an end of which is joined with a connecting terminal, having an elastic contact portion, the contact portion of the connecting terminal is deformed elastically by the terminal portion 42 or 43, so that the connecting terminal is connected electrically with the first conductor 46 or the second conductor 47. When the terminal portion abuts on the connecting terminal, if the pressing ribs (not shown) are provided in the terminal portions 42, 43, the terminal portions 42, 43 are not deformed and the connecting terminals contact satisfactorily to the first conductors 46 or the second conductor 47 to be connected electrically securely.

Thus, the two joining portions (terminal portions) 42, 43 of the flat circuit device 40 according to this invention perform respectively as a connecting terminal so that the first and the second conductors 46, 47 without another terminals at the both end thereof can be can be connected with a connector. The induced voltage produced by magnetic fluxes in directions of thickness and width of the flat circuit device are canceled to suppress noise generation and the shield effect of the flat circuit device is enhanced.

Providing positioning holes (not shown) respectively in the first and second insulators 42, 43 as mentioned above and inserting a positioning pin through the positioning holes when the insulator 41 is bonded, relative position of the first and the second insulators 42, 43 is always maintained so that the first and the second conductors 46, 47 can be positioned easily and then positioning accuracy and ease of manufacturing of the flat circuit device 40 are enhanced.

Providing slit portions (not shown) respectively at the center portion of each terminal portions and inserting the center-adjust projecting pieces of the pressing ribs into the slit portions, the center-adjust projecting pieces perform as partition walls to part the curved surfaces to the first conductor 46 and the second conductor 47 so that the connecting terminals can be contacted satisfactorily to the first and the second conductors 46, 47 without contact failure caused by moving the connecting terminals widthwise of the insulator.

While the forms of the invention herein disclosed constitute presently preferred embodiments, many others are possible. It is not intended herein to mention all the possible embodiments of the invention which will be apparent to those skilled in the art. It is understood that the term used herein are merely descriptive rather than limiting, in that various changes may be made without departing from the spirit or scope of this invention as defined by the following claims.

What is claimed is:

1. A flat circuit device comprising:
   a first conductor;
   a second conductor; and
   an insulator being provided between the first conductor and the second conductor, wherein the first conductor and the second conductor are located on opposites sides of said insulator to form an area being surrounded by the first conductor and the second conductor when viewed from a direction perpendicular to a surface of the insulator, wherein said insulator includes;
   a bent portion; and
   a laminated portion of a first insulator and a second insulator, whereby a side end of the first conductor at the bent portion extends straightly along a curved surface of the bent portion, whereby a side end of the second conductor at the bent portion extends straightly along a curved surface of the bent portion.

2. The flat circuit device according to claim 1, further comprising a pressing rib having a contact surface with U-shape in cross section to be contacted to the insulator in the bent portion, whereby the insulator is laminated by folding a flexible flat strip-like insulator.

3. The flat circuit device according to claim 2, wherein the insulator has a slit portion along a bending curve between the first conductor and the second conductor on a bent portion of the insulator and the pressing rib has a center-adjust projecting piece to be inserted into the slit portion on the contact surface of the pressing rib.

4. The flat circuit device according to claim 2, wherein the insulator has positioning holes, at the both end portions thereof, to be located on the same axis when the insulator is laminated.

5. The flat circuit device according to claim 1, wherein the insulator is laminated with a first insulator and a second insulator to fold a flexible flat insulator, which is provided in parallel with two strip-like portions of the first insulator and the second insulator to be connected by two portions of a first joining portion and a second joining portion, curvedly at the joining portions, whereby one end portion of the first conductor on the first insulator extends straightly at the first joining portion, and the other end portion of the first conductor extends straightly at the second joining portion, whereby one end portion of the second conductor on the second insulator extends straightly at the first joining portion, and the other end portion of the second conductor extends straightly at the second joining portion.

6. The flat circuit device according to claim 5, wherein the first and second conductors are formed into meandering curves symmetrical on respective base lines which are located on practically the same straight line when viewing from a direction perpendicular to a surface of the insulator, whereby the first and the second insulators have respectively insulating pieces for surrounding alternately turning portions of the first and the second conductors forming areas surrounded by the first and the second conductors, and have respectively slits for inserting the insulating pieces therethrough to place partial areas of the first and the second conductors respectively on each surface opposite to the laminated surface of the other insulator.

7. The flat circuit device according to claim 5, wherein the first conductor is formed into a wave-shape meandering curve, wherein the second conductor is formed into a curve having a smaller amplitude than that of the first conductor on a base line to be a straight line being located on practically the same base line of the first conductor when viewing from a direction perpendicular to the surface of the insulator to place cross points of the first and the second conductor on the straight line, whereby the laminated two insulators is curved or bent to place the base line of the first conductor on top of curved form when viewing from a direction perpendicular to the surface of the insulator and to place the base line of the second conductor on practically the same straight line as the base line of the first conductor being formed into a wave-shape meandering curve when viewing from a direction of width of the insulator.

8. The flat circuit device according to any one of claim 5, 6, or 7, wherein a pressing rib having a contact surface with U-shape in cross section to be contacted to the insulator is provided in the curved joining portion.

* * * * *